(12) United States Patent
Shen et al.

(10) Patent No.: US 8,158,888 B2
(45) Date of Patent: Apr. 17, 2012

(54) CIRCUIT SUBSTRATE AND METHOD OF FABRICATING THE SAME AND CHIP PACKAGE STRUCTURE

(75) Inventors: Chi-Chih Shen, Kaohsiung (TW); Jen-Chuan Chen, Taoyuan County (TW); Wei-Chung Wang, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 294 days.

(21) Appl. No.: 12/490,077

(22) Filed: Jun. 23, 2009

(65) Prior Publication Data

US 2010/0000775 A1    Jan. 7, 2010

(30) Foreign Application Priority Data

Jul. 3, 2008   (TW) ................ 97125137 A (51) Int. Cl.
*H05K 1/16* (2006.01)
(52) U.S. Cl. .................. 174/260; 174/255
(58) Field of Classification Search .......... None
See application file for complete search history.

(56) References Cited

U.S. PATENT DOCUMENTS

| | | |
|---|---|---|
| 5,128,831 A | 7/1992 | Fox, III et al. |
| 5,222,014 A | 6/1993 | Lin |
| 5,355,580 A | 10/1994 | Tsukada |
| 5,400,948 A * | 3/1995 | Sajja et al. ............ 228/180.1 |
| 5,579,207 A | 11/1996 | Hayden et al. |
| 5,594,275 A | 1/1997 | Kwon et al. |
| 5,608,265 A | 3/1997 | Kitano et al. |
| 5,714,800 A | 2/1998 | Thompson |
| 5,726,493 A | 3/1998 | Yamashita et al. |
| 5,748,452 A | 5/1998 | Londa |
| 5,763,939 A | 6/1998 | Yamashita |
| 5,844,315 A | 12/1998 | Melton et al. |
| 5,861,666 A | 1/1999 | Bellaar |
| 5,883,426 A | 3/1999 | Tokuno et al. |
| 5,889,655 A * | 3/1999 | Barrow ................ 361/760 |
| 5,892,290 A | 4/1999 | Chakravorty et al. |
| 5,973,393 A | 10/1999 | Chia et al. |
| 5,985,695 A | 11/1999 | Freyman et al. |

(Continued)

FOREIGN PATENT DOCUMENTS

JP    07335783    12/1995

(Continued)

OTHER PUBLICATIONS

Yoshida et al., A Study on Package Stacking Process for Package-on-Package (PoP) Electronic Components and Tech. Conf. (ECTC), May 2006, San Diego, CA.

(Continued)

*Primary Examiner* — Ishwarbhai Patel
(74) *Attorney, Agent, or Firm* — Foley & Lardner LLP (57) ABSTRACT

A circuit substrate suitable for being connected to at least one solder ball is provided. The circuit substrate includes a substrate, at least one bonding pad, and a solder mask. The substrate has a surface. The bonding pad is disposed on the surface of the substrate for being connected to the solder ball. The solder mask covers the surface of the substrate and has an opening for exposing a portion of the bonding pad. The opening has a first end and a second end. As compared with the second end, the first end is much farther from the bonding pad, and a diameter of the first end is larger than that of the second end.

27 Claims, 13 Drawing Sheets

U.S. PATENT DOCUMENTS

| | | |
|---|---|---|
| 6,177,724 B1 | 1/2001 | Sawai |
| 6,194,250 B1 | 2/2001 | Melton et al. |
| 6,195,268 B1 | 2/2001 | Eide |
| 6,303,997 B1 | 10/2001 | Lee |
| 6,451,624 B1 | 9/2002 | Farnworth et al. |
| 6,489,676 B2 | 12/2002 | Taniguchi et al. |
| 6,501,165 B1 | 12/2002 | Farnworth et al. |
| 6,614,104 B2 | 9/2003 | Farnworth et al. |
| 6,740,546 B2 | 5/2004 | Corisis et al. |
| 6,740,964 B2 | 5/2004 | Sasaki |
| 6,787,392 B2 | 9/2004 | Quah |
| 6,798,057 B2 | 9/2004 | Bolkin et al. |
| 6,812,066 B2 | 11/2004 | Taniguchi et al. |
| 6,815,254 B2 | 11/2004 | Mistry et al. |
| 6,828,665 B2 | 12/2004 | Pu et al. |
| 6,847,109 B2 | 1/2005 | Shim |
| 6,861,288 B2 | 3/2005 | Shim et al. |
| 6,888,255 B2 | 5/2005 | Murtuza et al. |
| 6,924,550 B2 | 8/2005 | Corisis et al. |
| 6,936,930 B2 | 8/2005 | Wang |
| 6,974,334 B2 | 12/2005 | Hung |
| 7,002,805 B2 | 2/2006 | Lee |
| 7,015,571 B2 | 3/2006 | Chang et al. |
| 7,026,709 B2 | 4/2006 | Tsai et al. |
| 7,029,953 B2 | 4/2006 | Sasaki |
| 7,034,386 B2 | 4/2006 | Kurita |
| 7,049,692 B2 | 5/2006 | Nishimura et al. |
| 7,061,079 B2 | 6/2006 | Weng et al. |
| 7,071,028 B2 | 7/2006 | Koike et al. |
| 7,185,426 B1 | 3/2007 | Hiner et al. |
| 7,187,068 B2 | 3/2007 | Suh et al. |
| 7,242,081 B1 | 7/2007 | Lee |
| 7,262,080 B2 | 8/2007 | Go et al. |
| 7,279,784 B2 | 10/2007 | Liu |
| 7,279,789 B2 | 10/2007 | Cheng |
| 7,288,835 B2 | 10/2007 | Yim et al. |
| 7,309,913 B2 | 12/2007 | Shim et al. |
| 7,345,361 B2 | 3/2008 | Mallik et al. |
| 7,354,800 B2 | 4/2008 | Carson |
| 7,364,945 B2 | 4/2008 | Shim et al. |
| 7,364,948 B2 | 4/2008 | Lai et al. |
| 7,365,427 B2 | 4/2008 | Lu et al. |
| 7,372,141 B2 | 5/2008 | Karnezos et al. |
| 7,372,151 B1 | 5/2008 | Fan et al. |
| 7,408,244 B2 | 8/2008 | Lee et al. |
| 7,417,329 B2 | 8/2008 | Chuang et al. |
| 7,429,786 B2 | 9/2008 | Karnezos et al. |
| 7,429,787 B2 | 9/2008 | Karnezos et al. |
| 7,436,055 B2 | 10/2008 | Hu |
| 7,436,074 B2 | 10/2008 | Pan et al. |
| 7,473,629 B2 | 1/2009 | Tai et al. |
| 7,485,970 B2 | 2/2009 | Hsu et al. |
| 7,550,832 B2 | 6/2009 | Weng et al. |
| 7,550,836 B2 | 6/2009 | Chou et al. |
| 7,560,818 B2 | 7/2009 | Tsai |
| 7,586,184 B2 | 9/2009 | Hung et al. |
| 7,589,408 B2 | 9/2009 | Weng et al. |
| 7,633,765 B1 | 12/2009 | Scanlan et al. |
| 7,642,133 B2 | 1/2010 | Wu et al. |
| 7,671,457 B1 | 3/2010 | Hiner et al. |
| 7,719,094 B2 | 5/2010 | Wu et al. |
| 7,723,839 B2 | 5/2010 | Yano et al. |
| 7,737,539 B2 | 6/2010 | Kwon et al. |
| 7,737,565 B2 | 6/2010 | Coffy |
| 7,777,351 B1 | 8/2010 | Berry et al. |
| 7,838,334 B2 | 11/2010 | Yu et al. |
| 2003/0129272 A1 | 7/2003 | Shen et al. |
| 2004/0106232 A1 | 6/2004 | Sakuyama et al. |
| 2004/0124515 A1 | 7/2004 | Tao et al. |
| 2004/0126927 A1 | 7/2004 | Lin et al. |
| 2004/0191955 A1 | 9/2004 | Joshi et al. |
| 2005/0054187 A1* | 3/2005 | Ding et al. ............ 438/612 |
| 2005/0117835 A1 | 6/2005 | Nguyen et al. |
| 2005/0121764 A1 | 6/2005 | Mallik |
| 2006/0035409 A1 | 2/2006 | Suh et al. |
| 2006/0170112 A1 | 8/2006 | Tanaka et al. |
| 2006/0220210 A1 | 10/2006 | Karnezos et al. |
| 2006/0240595 A1 | 10/2006 | Lee |
| 2006/0244117 A1 | 11/2006 | Karnezos et al. |
| 2007/0029668 A1 | 2/2007 | Lin et al. |
| 2007/0090508 A1 | 4/2007 | Lin et al. |
| 2007/0108583 A1 | 5/2007 | Shim et al. |
| 2007/0241453 A1 | 10/2007 | Ha et al. |
| 2007/0273049 A1 | 11/2007 | Khan et al. |
| 2007/0290376 A1 | 12/2007 | Zhao et al. |
| 2008/0017968 A1* | 1/2008 | Choi et al. ............ 257/686 |
| 2008/0073769 A1 | 3/2008 | Wu et al. |
| 2008/0116574 A1 | 5/2008 | Fan |
| 2008/0230887 A1 | 9/2008 | Sun et al. |
| 2010/0032821 A1 | 2/2010 | Pagaila et al. |
| 2010/0171205 A1 | 7/2010 | Chen et al. |
| 2010/0171206 A1 | 7/2010 | Chu et al. |
| 2010/0171207 A1 | 7/2010 | Shen et al. |
| 2011/0049704 A1 | 3/2011 | Sun et al. |
| 2011/0117700 A1 | 5/2011 | Weng et al. |
| 2011/0156251 A1 | 6/2011 | Chu et al. |
| 2011/0241193 A1 | 10/2011 | Ding et al. |

FOREIGN PATENT DOCUMENTS

| | | |
|---|---|---|
| JP | 2000294720 | 10/2000 |
| JP | 2002158312 | 5/2002 |
| JP | 2002170906 | 6/2002 |
| JP | 2004327855 | 11/2004 |
| JP | 2009054686 | 3/2009 |
| KR | 20020043435 | 6/2002 |
| KR | 20030001963 | 1/2003 |
| TW | 529155 | 4/2003 |
| TW | 229927 | 3/2005 |
| TW | 200611305 | 4/2006 |

OTHER PUBLICATIONS

Dreiza et al., "High Density PoP (Package-on-Package) and Package Stacking Development" Electronic Components and Technology Conf. (May 2007).

* cited by examiner

CIRCUIT SUBSTRATE AND METHOD OF FABRICATING THE SAME AND CHIP PACKAGE STRUCTURE

CROSS-REFERENCE TO RELATED APPLICATION

This application claims the priority benefit of Taiwan application Ser. No. 97125137, filed Jul. 3, 2008. The entirety of the above-mentioned patent application is hereby incorporated by reference herein and made a part of this specification.

BACKGROUND OF THE INVENTION

1. Field of the Invention

The present invention generally relates to a circuit substrate and a method of fabricating the same, in particular, to a circuit substrate in which a solder mask covering a surface thereof has at least one opening, with an upper diameter larger than a lower diameter, for exposing a bonding pad, and a method of fabricating the same.

2. Description of Related Art

Recently, with the increasingly high demand of the market on electronic products and the advanced processing technique, more and more 3C products emphasize portable convenience and popularization of the demand of the market, the conventional signal chip packaging technique cannot meet the increasingly new demand of the market, it has become a well-known product trend to design and manufacture products with characteristics of being light, thin, short, and small, an increased packaging density, and a low cost. Therefore, under the precondition of being light, thin, short, and small, various integrated circuits (ICs) with different functions are integrated by using various stacking packaging manners, so as to reduce the package volume and package thickness, which is a main stream for the research on the market of various packaging products. As for the current various packaging products under mass production, package on package (POP) and package in package (PIP) products are new products as the main stream of the research in response to the development trend.

Figure 1A:
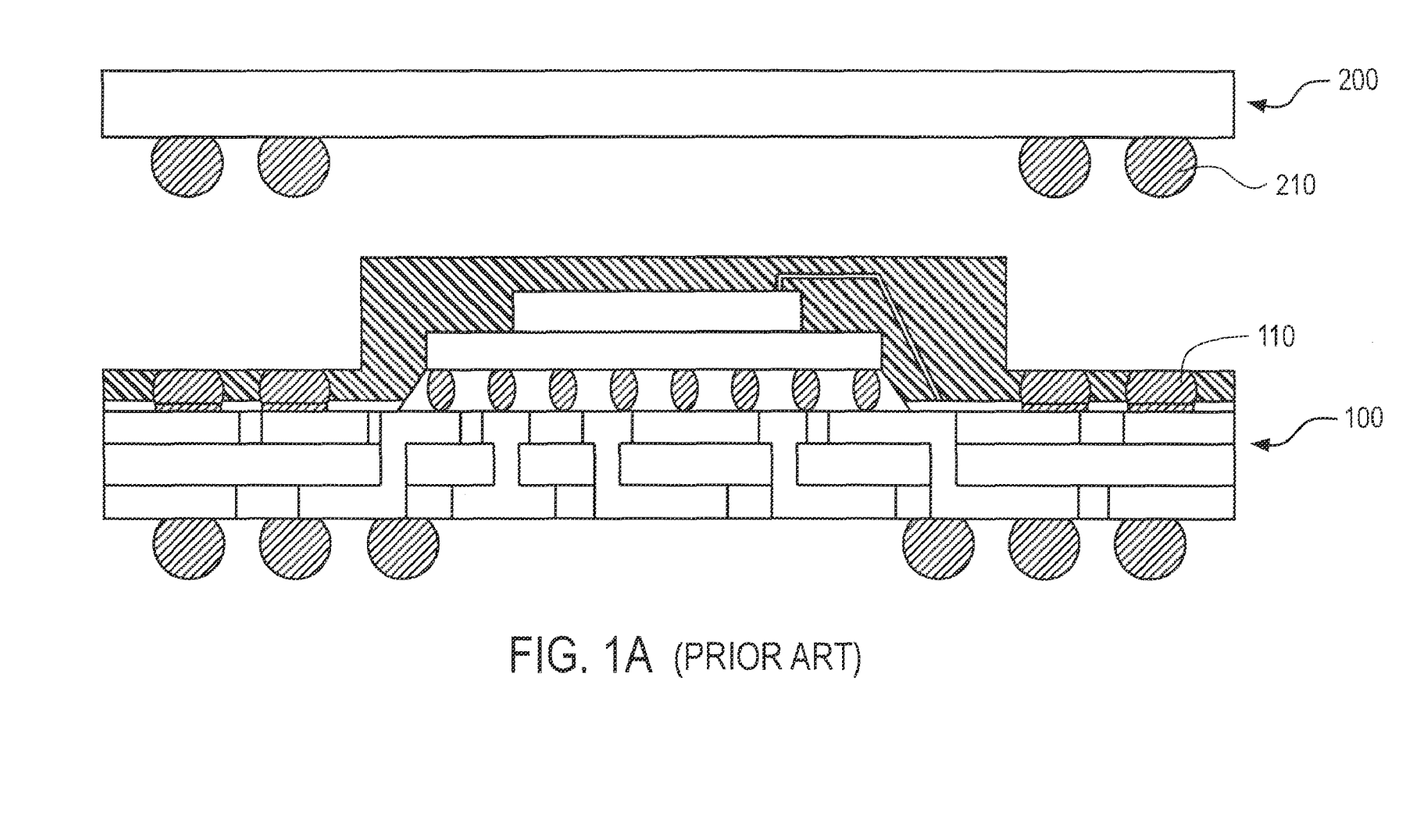
FIG. 1A is a schematic cross-sectional view of a conventional POP package structure, in which pre-solders on a circuit substrate are not bonded with solder balls on an opposite package.
Figure 1B:
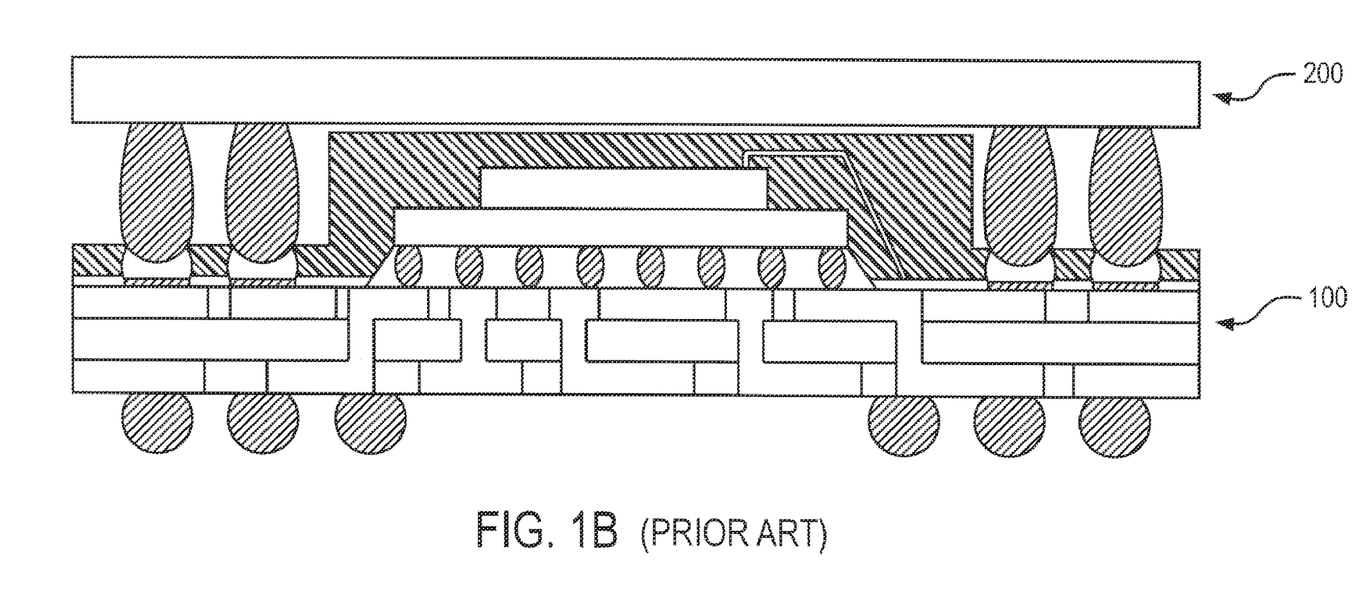
FIG. 1B is a schematic partially-enlarged view after the pre-solders as shown in FIG. 1A are bonded with the solder balls.

FIG. 1A is a schematic cross-sectional view of a conventional POP package structure, in which pre-solders on a circuit substrate are not bonded with solder balls on an opposite package, and FIG. 1B is a schematic partially-enlarged view after the pre-solders as shown in FIG. 1A are bonded with the solder balls. Referring to FIGS. 1A and 1B, when the first package 100 and the second package 200 are stacked, through reflow soldering, solder balls 110 disposed on the first package 100 are turned into a melted state, and then bonded with corresponding solder balls 210 on the second package 200, thereby being electrically connected to each other.

However, as shown in FIG. 1B, during the reflow soldering process, since an opening at an upper end of the solder ball 110 is relatively small, and due to the surface tension, after the solder balls 110 are melted, they may be spilled upwards via the opening at the upper end, and a lower part thereof may be turned in a hollow state. As a result, the first package 100 and the second package 200 cannot be electrically connected to each other, such that the yield of the produces is reduced.

SUMMARY OF THE INVENTION

Accordingly, the present invention is directed to a circuit substrate and a method of fabricating the same, in which through changing a thickness of a solder mask and a shape of an opening in the solder mask, a pre-solder disposed in the opening is prevented from being spilled out off the opening during a reflow soldering process, so as to enhance the reliability for bonding the circuit substrate with another package.

The present invention provides a circuit substrate, suitable for being connected to at least one solder ball. The circuit substrate includes a substrate, at least one bonding pad, and a solder mask. The substrate has a surface. The bonding pad is disposed on the surface of the substrate for being connected to the solder ball. The solder mask covers the surface of the substrate and has an opening for exposing a portion of the bonding pad. The opening has a first end and a second end. As compared with the second end, the first end is much farther from the bonding pad, and a diameter of the first end is larger than that of the second end.

In an embodiment of the present invention, a thickness of the solder mask is larger than 30 μm.

In an embodiment of the present invention, a thickness of the solder mask falls between 50 μm and 150 μm.

In an embodiment of the present invention, a proportion of the diameter of the second end to that of the first end falls between 0.8 and 0.9.

In an embodiment of the present invention, the opening is a tapered opening.

In an embodiment of the present invention, the circuit substrate further includes: a pre-solder, disposed on the exposed bonding pad, in which the bonding pad is connected to the solder ball through the pre-solder.

In an embodiment of the present invention, the pre-solder is filled in the opening.

In an embodiment of the present invention, the substrate further comprises a first surface opposite to the surface and the circuit substrate further comprises a first solder mask which covers the first surface of the substrate wherein the thickness of the solder mask is different from the thickness of the first solder mask.

In an embodiment of the present invention, the thickness of the solder mask is larger than the thickness of the first solder mask.

In an embodiment of the present invention, the circuit substrate further comprises a plurality of first bonding pads disposed on a center portion of the surface of the substrate wherein the solder mask comprises a center opening which exposes the first bonding pads and a diameter of the center opening is larger than a diameter of the opening.

In an embodiment of the present invention, the circuit substrate further comprises a metal layer covering the first bonding pads.

In an embodiment of the present invention, the metal layer comprises a gold layer or a solder layer.

In an embodiment of the present invention, the solder mask is formed by stacking a plurality of solder masks together.

The present invention further provides a method of fabricating a circuit substrate, which includes the following steps. Firstly, a core layer, a first patterned circuit layer, and a second patterned circuit layer are provided. The first patterned circuit layer and the second patterned circuit layer are respectively disposed on a first surface and a second surface of the core layer, so as to be electrically connected to each other through a plurality of conductive through-holes penetrating the core layer, and the first patterned circuit layer has at least one bonding pad. Next, a solder mask is formed on the first patterned circuit layer. Finally, an opening is formed in the solder mask, for exposing a portion of the bonding pad, in which the opening includes a first end and a second end, the first end is much farther from the bonding pad as compared with the second end, and a diameter of the first end is larger than that of the second end.

In an embodiment of the present invention, a thickness of the solder mask is larger than 30 μm.

In an embodiment of the present invention, a thickness of the solder mask falls between 50 μm and 150 μm.

In an embodiment of the present invention, a proportion of the diameter of the second end to that of the first end falls between 0.8 and 0.9.

In an embodiment of the present invention, the opening is a tapered opening.

In an embodiment of the present invention, the solder mask is formed by stacking a plurality of solder masks together. Each solder mask has an opening, and a diameter of a second end of each opening is larger than that of a first end of the opening located under the second end.

In an embodiment of the present invention, the method of fabricating the circuit substrate further includes forming a pre-solder on the bonding pad exposed by the opening.

The present invention provides a chip package structure. The chip package structure includes a substrate, at least one bonding pad, a plurality of first bonding pads, a solder mask, and a chip. The substrate has a surface. The bonding pad is disposed on the surface of the substrate for being connected to the solder ball. The first bonding pads are disposed on a center portion of the surface of the substrate. The solder mask covers the surface of the substrate and has an opening for exposing a portion of the bonding pad and a center opening which exposes the first bonding pads. The opening has a first end and a second end. As compared with the second end, the first end is much farther from the bonding pad, and a diameter of the first end is larger than that of the second end.

In an embodiment of the present invention, the chip package structure further comprises an underfill layer which is filled between the chip and the substrate.

In an embodiment of the present invention, the chip package structure further comprises a plurality of bumps which is disposed between the chip and the substrate and electrically connects the chip and the first bonding pads.

In an embodiment of the present invention, the chip package structure further comprises a pre-solder, disposed on the exposed portion of the bonding pad and filled in the opening.

In an embodiment of the present invention, the chip package structure further comprises a first chip package structure which is disposed on the substrate and electrically connected to the pre-solder.

In an embodiment of the present invention, the chip package structure further comprises a molding compound which is disposed on the substrate and covers the chip.

In an embodiment of the present invention, the solder mask and the molding compound have at least one recess exposing the pre-solder.

In an embodiment of the present invention, the chip package structure further comprises a first chip package structure which is disposed on the substrate and electrically connected to the pre-solder.

In the circuit substrate and the method of fabricating the same according to the present invention, the thickness of the solder mask is mainly increased, and the opening with an upper diameter larger than a lower diameter for exposing the bonding pad is formed in the solder mask. Therefore, the diameter of the upper end of the opening is larger than that of the lower end, so that the pre-solder disposed in the opening is not spilled from the opening during the reflow soldering process, so as to enhance the reliability of bonding the circuit substrate with another package.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 2A:
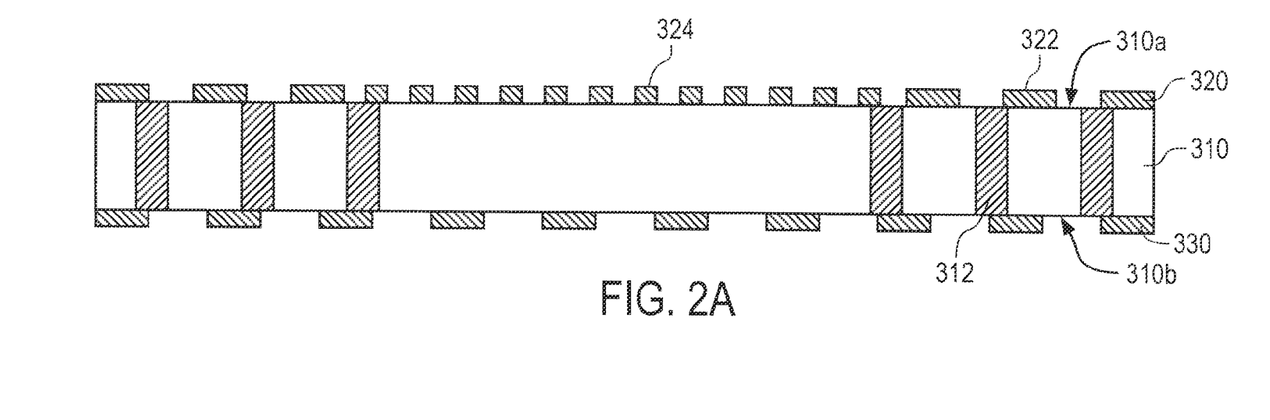
FIGS. 2A to 2C are schematic cross-sectional views of a flow for fabricating a circuit substrate according to an embodiment of the present invention.
Figure 2B:
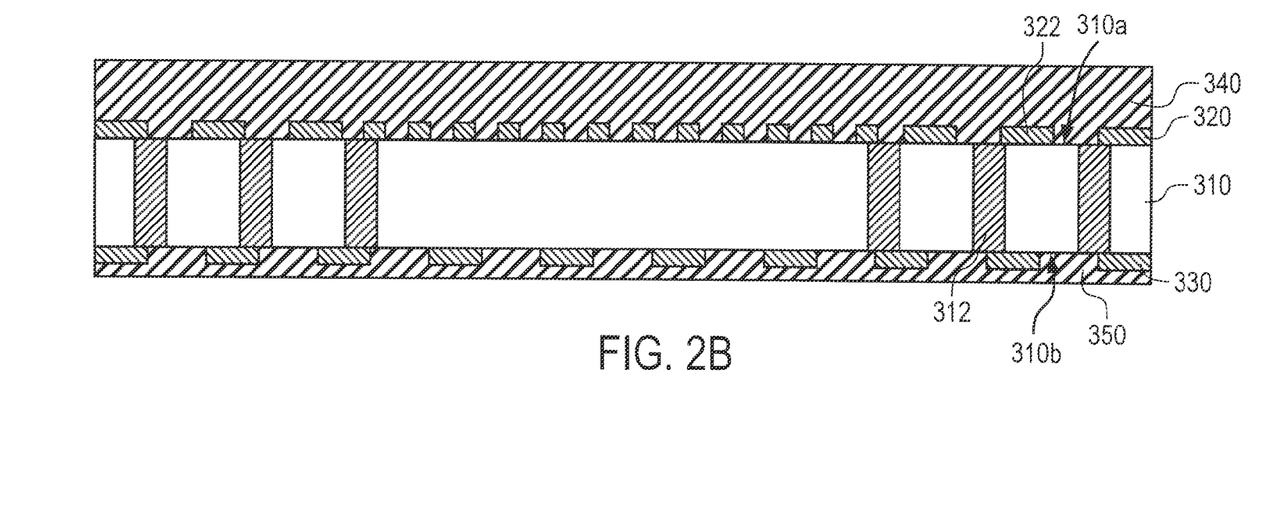
Figure 2C:
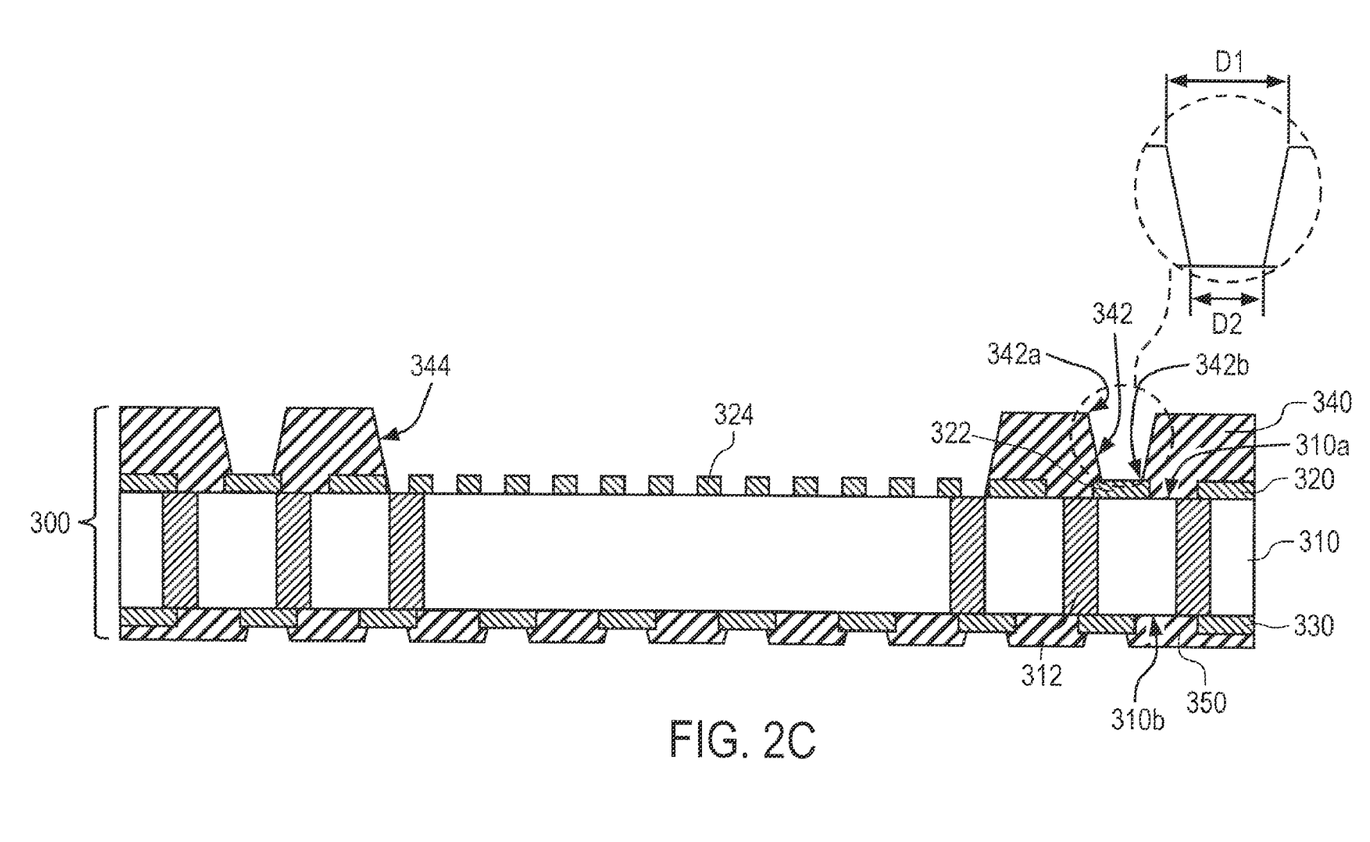

FIGS. 2A to 2C are schematic cross-sectional views of a flow for fabricating a circuit substrate according to an embodiment of the present invention. Firstly, referring to FIG. 2A, a core layer 310, a first patterned circuit layer 320, and a second patterned circuit layer 330 are provided. The first patterned circuit layer 320 and the second patterned circuit layer 330 are respectively disposed on a first surface 310a and a second surface 310b of the core layer 310, so as to be electrically connected to each other through a plurality of conductive through-holes 312 penetrating the core layer 310. In this embodiment, the core layer 310 may be a substrate made of a dielectric material, and the first patterned circuit layer 320 and the second patterned circuit layer 330 are, for example, formed by etching copper foils. In addition, the first patterned circuit layer 320 has at least one bonding pad 322 and a plurality of first bonding pads 324 disposing on a center portion of the core layer 310. In this embodiment, a metal layer (not shown) covers the first bonding pads 324 wherein the metal layer includes a gold layer or a solder layer.

Next, referring to FIG. 2B, a solder mask 340 is formed on the first patterned circuit layer 320. A thickness of the solder mask 340 is, for example, larger than 30 μm, which preferably falls between 50 μm and 150 μm. When the solder mask 340 is formed on the first patterned circuit layer 320, another solder mask 350 may be formed on the second patterned circuit layer 330 at the same time. However, it is not necessary to particularly increase the thickness of the solder mask 350, so the thickness of the solder mask 350 is the same as that of a common solder mask 350, which is approximately 30 μm. The thickness of the solder mask 340 is different from the thickness of the solder mask 350. In this embodiment, the thickness of the solder mask 340 is larger than the thickness of the solder mask 350.

Then, referring to FIG. 2C, an opening 342 is formed in the solder mask 340, for exposing a portion of the bonding pad 322. The opening 342 has a first end 342a and a second end 342b. The first end 342a is much farther from the bonding pad 322 as compared with the second end 342b, and a diameter D1 of the first end 342a is larger than a diameter D2 of the second end 342b, that is, the opening 342 is a tapered opening. In this manner, the basic flow for fabricating the circuit substrate 300 of the present invention is finished. During the practical fabrication, the opening 342 with an upper diameter larger than a lower diameter may be formed by controlling exposing and developing parameters. In addition, in an embodiment of the present invention, a proportion of the diameter D2 of the second end 342b to the diameter D1 of the first end 342a preferably is between 0.8 and 0.9. In this embodiment, the solder mask 340 may has a center opening 344 exposing a central portion of the first patterned circuit layer 320 for carrying the chip. In particular, the center opening 344 exposes the first bonding pads 324. In this embodiment, a diameter of the center opening 344 is larger than a diameter of the opening 342.

Figure 2D:
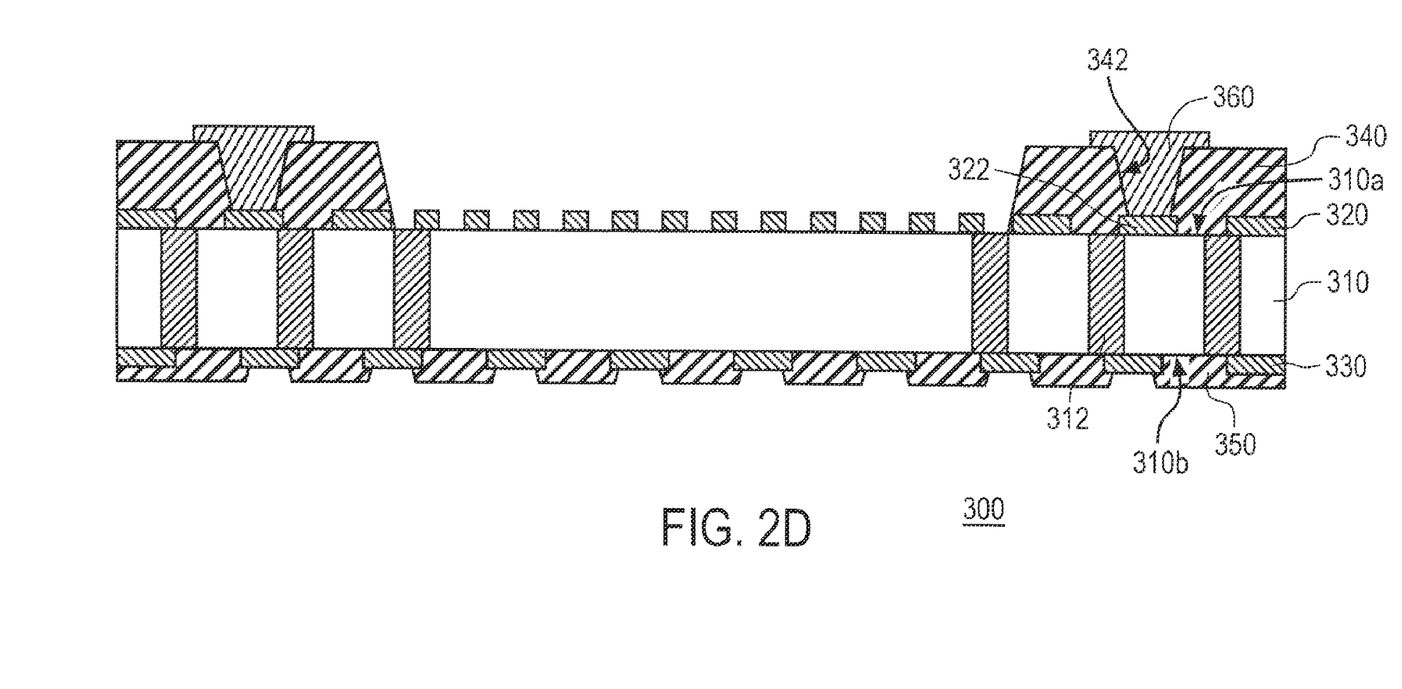
FIG. 2D is a schematic cross-sectional view of forming a pre-solder on a bonding pad as shown in FIG. 2C.

After the above fabricating flows have been finished, referring to FIG. 2D, a pre-solder 360 may be formed on the bonding pad 322 exposed by the opening 342. The pre-solder 360 may be filled in the opening 342. The opening 342 in the solder mask 340 of the present invention is in a shape with the upper diameter larger than the lower diameter, so that the pre-solder 360 is prevented from being absorbed upwards to spill out when the pre-solder 360 is bonded with the solder ball of the opposite package during the subsequent reflow soldering process. Therefore, it is helpful for enhancing the reliability of the fabricated POP package structure.

Figure 3A:
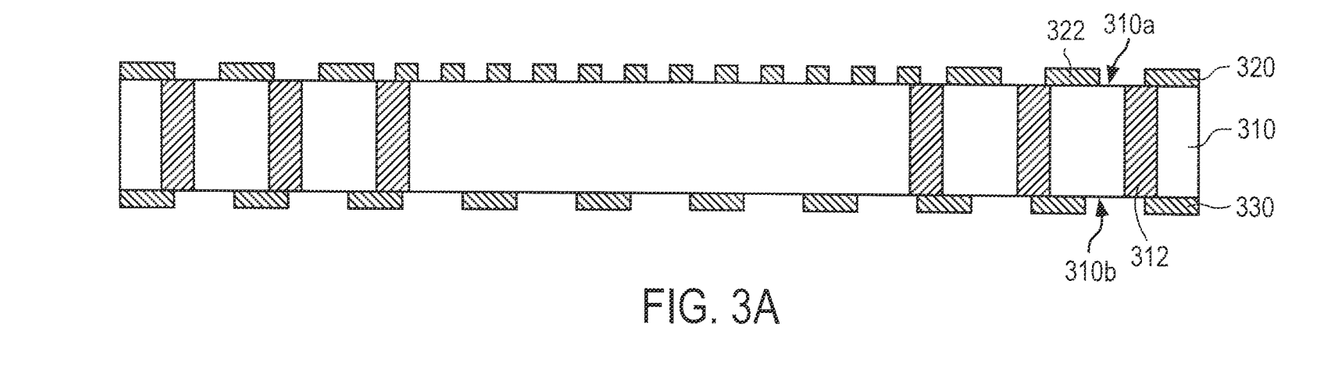
FIGS. 3A to 3I are schematic cross-sectional views of a flow for fabricating a circuit substrate according to another embodiment of the present invention.

FIGS. 3A to 3I are schematic cross-sectional views of a flow for fabricating a circuit substrate according to another embodiment of the present invention. When the solder mask is fabricated, the solder mask cannot reach a thickness between 50 μm and 150 μm for one time, and thus, it may reach the required thickness through stacking a plurality of solder masks together. Firstly, as shown in FIG. 3A, a core layer 310, a first patterned circuit layer 320, and a second patterned circuit layer 330 are provided. The first patterned circuit layer 320 and the second patterned circuit layer 330 are respectively disposed on a first surface 310a and a second surface 310b of the core layer 310, so as to be electrically connected to each other through a plurality of conductive through-holes 312 penetrating the core layer 310. The first patterned circuit layer 320 has at least one bonding pad 322.

Figure 3B:
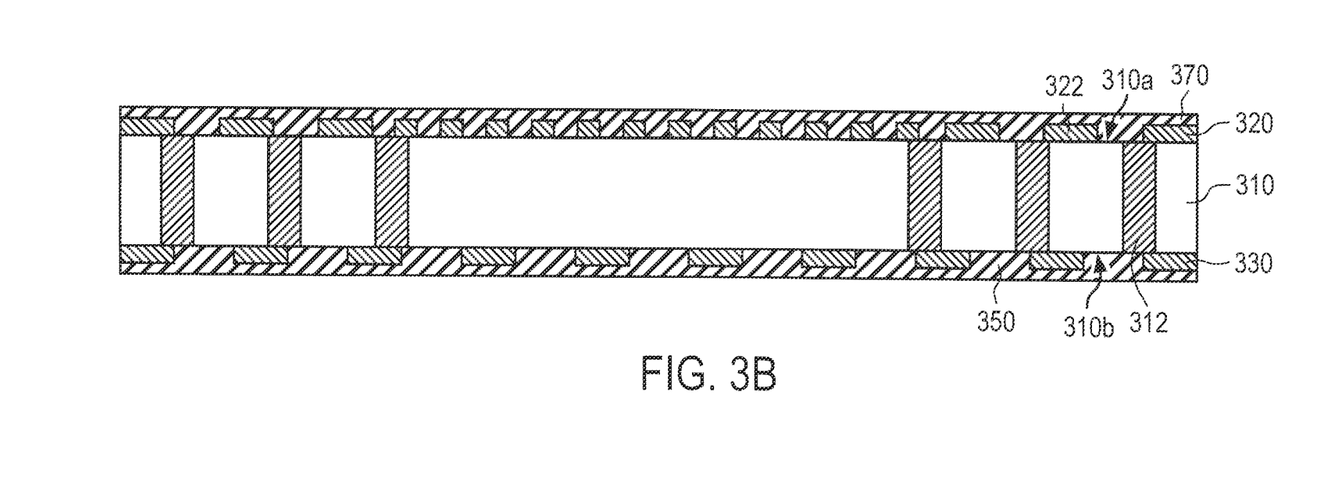
Figure 3C:
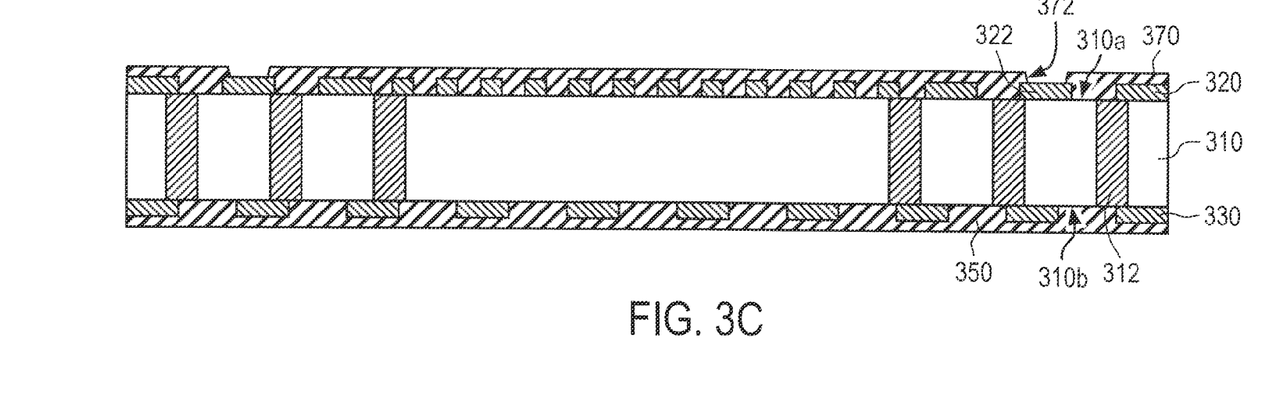

Then, referring to FIG. 3B, a solder mask 370 is formed on the first patterned circuit layer 320. The thickness of the solder mask 370 is the same as that of a common solder mask, which is approximately 30 μm. Next, referring to FIG. 3C, an opening 372 is formed in the solder mask 370, for exposing a portion of the bonding pad 322. Similarly, a top diameter of the opening 372 is larger than a bottom diameter thereof, so that the opening 372 is a tapered opening.

Figure 3D:
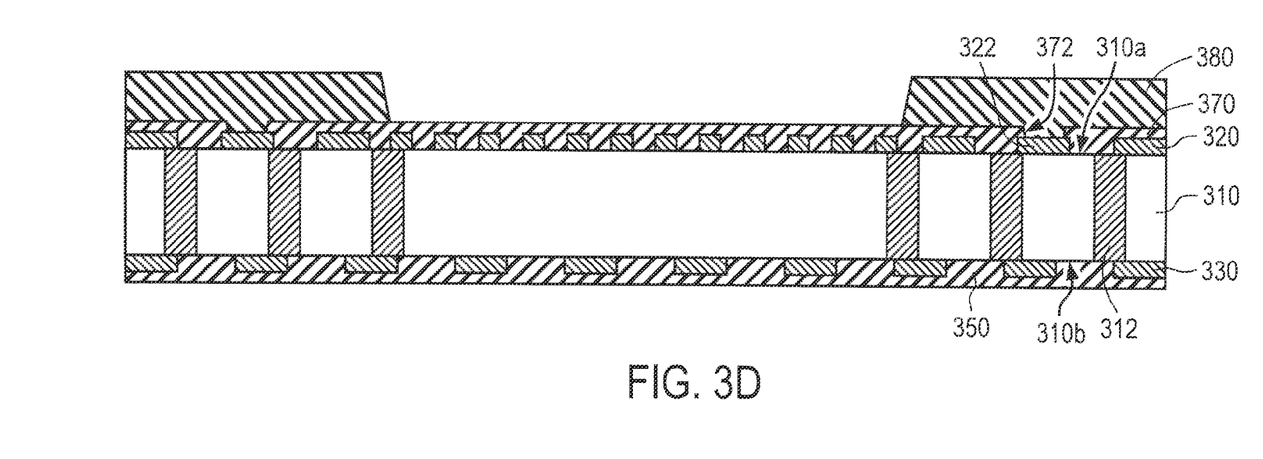
Figure 3E:
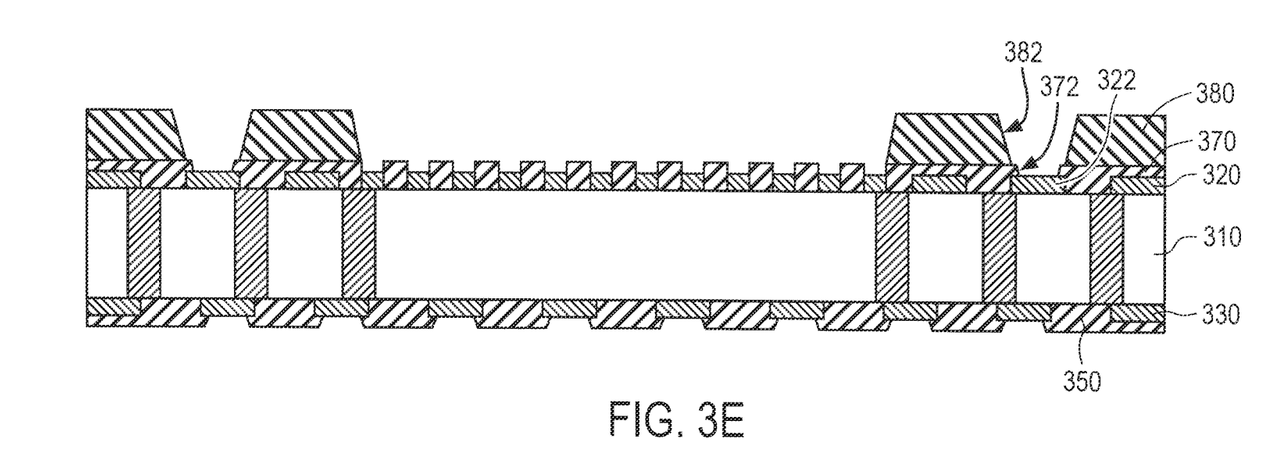

Next, referring to FIG. 3D, another solder mask 380 is formed on the solder mask 370. The thickness of the stacked solder mask 380 approximately falls between 20 μm and 120 μm. In this manner, the thickness of the entire solder mask falls between 50 μm and 150 μm. Then, referring to FIG. 3E, an opening 382 is formed in the solder mask 380. Similarly, a top diameter of the opening 382 is larger than a bottom diameter thereof. In addition, the bottom diameter of the opening 382 is larger than the top diameter of the opening 372 under the opening 382, so as to form a step-like opening with the upper diameter larger than the lower diameter. In this embodiment, for example, two solder masks are stacked together. However, a solder mask with a required thickness may be formed by stacking a plurality of solder masks together, and an opening with an upper diameter larger than a lower diameter is respectively formed in each solder mask.

Figure 3F:
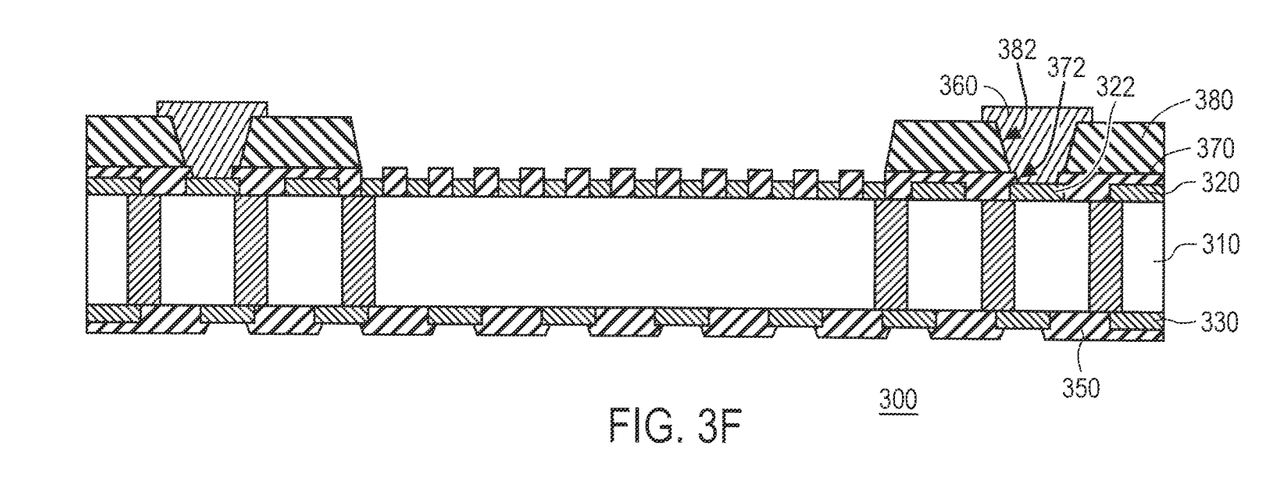
Figure 3G:
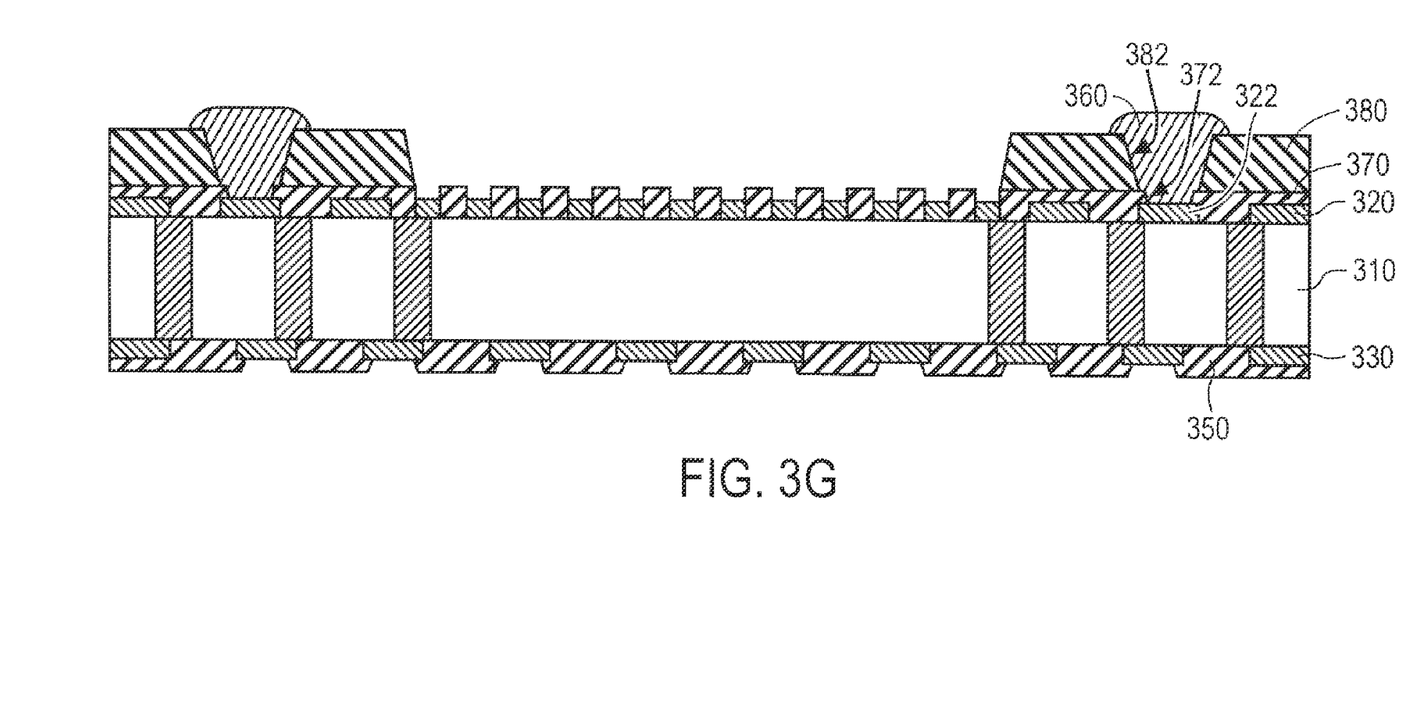
Figure 3H:
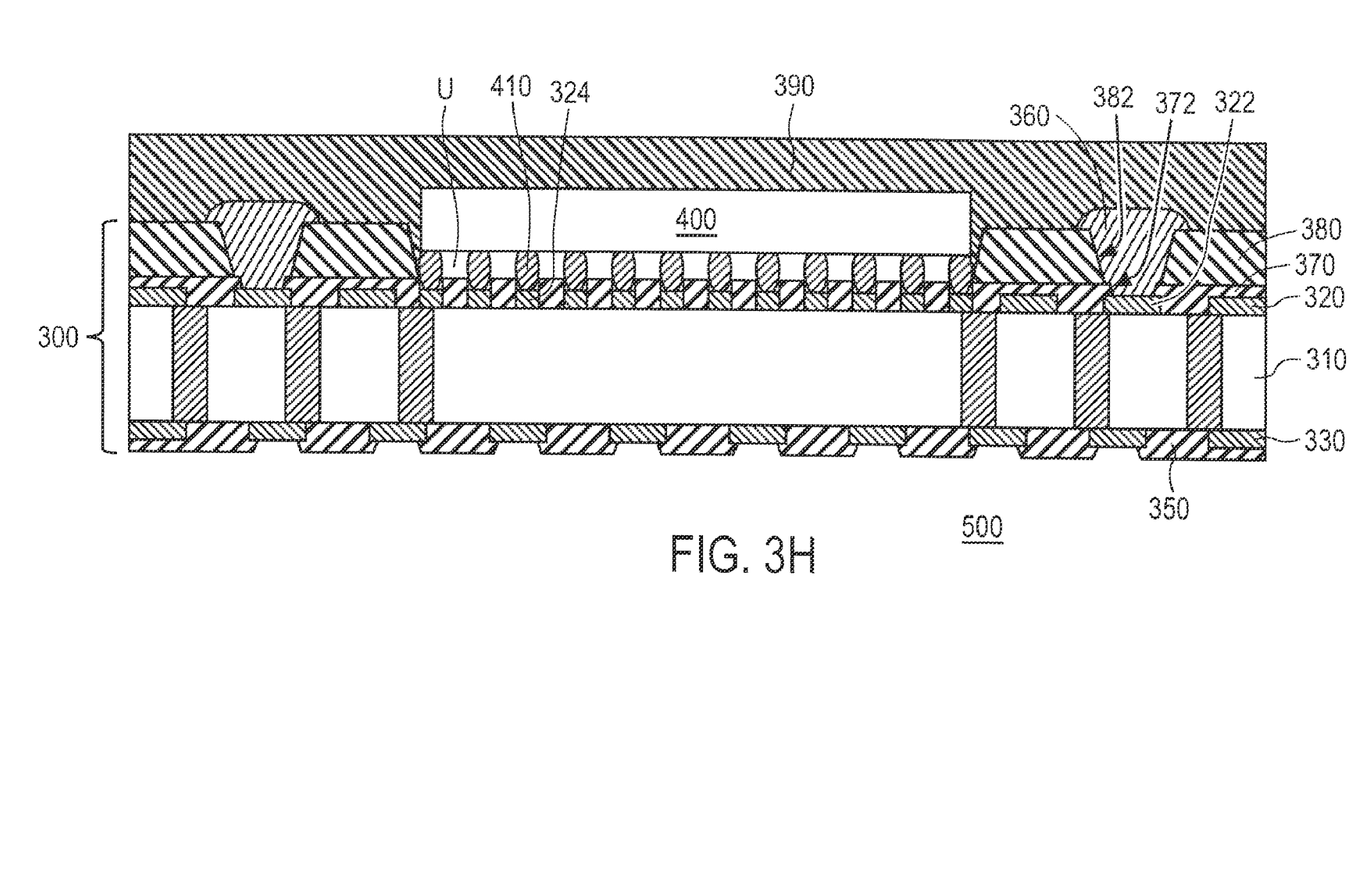

Next, referring to FIG. 3F, a pre-solder 360 is formed on the bonding pad 322, and referring to FIG. 3G, a reflow soldering process is performed on the pre-solder 360. Then, referring to FIG. 3H, a chip 400 is electrically connected to the first patterned circuit layer 320 of the circuit substrate 300 in a manner of flip chip, and then, a molding compound 390 is formed on the circuit substrate 300, for covering the chip 400. The chip 400 is electrically connected to the first bonding pads 324 through a plurality of bumps 410 disposed between the chip 400 and the core layer 310. An underfill U is formed between the chip 400 and the core layer 310. In this manner, a chip package structure 500 is formed. Finally, referring to FIG. 3I, a portion of the molding compound 390 and a portion of the solder mask 380 are removed to form two recess R exposing the solder filled in the openings 372 and 382, thereby being connected to an opposite package. On the circuit substrate 300, no matter how deep the molding compound 390 is cut, the openings 372 and 382 maintain the state with the upper diameter larger than the lower diameter. Therefore, when the solder of the circuit substrate 300 is bonded with the solder ball of another package during the reflow soldering process, the solder in the openings of the solder masks is not spilled out of the openings to result in a hollow phenomenon, thereby enhancing the reliability of bonding the circuit substrate with another package.

Figure 3I:
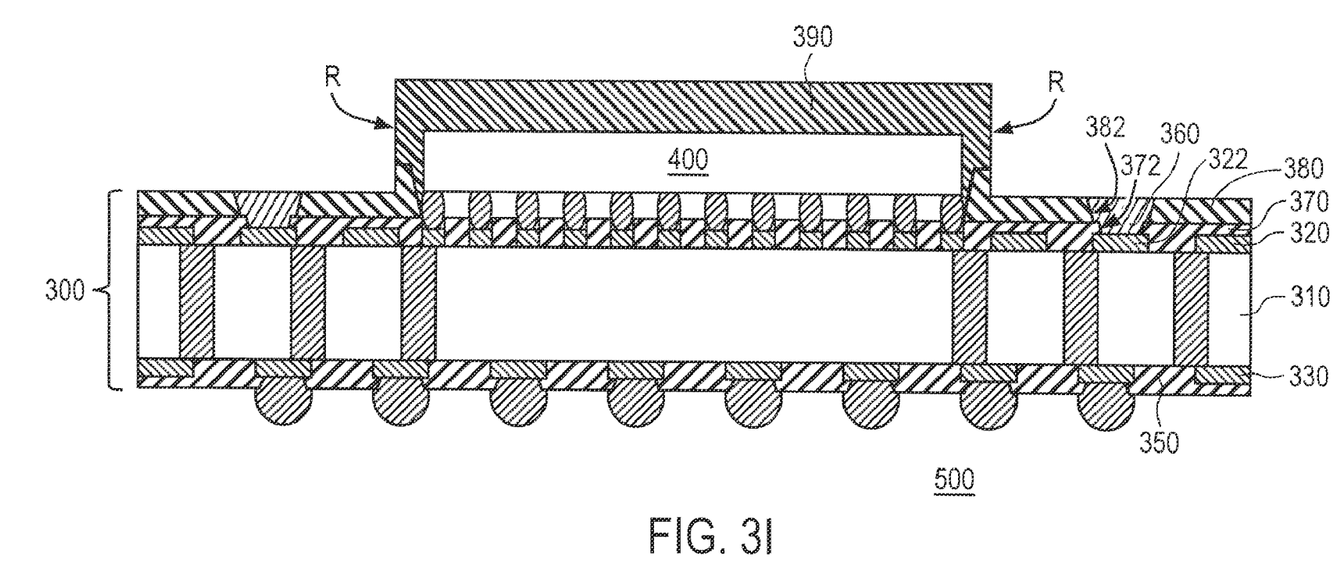
Figure 4:
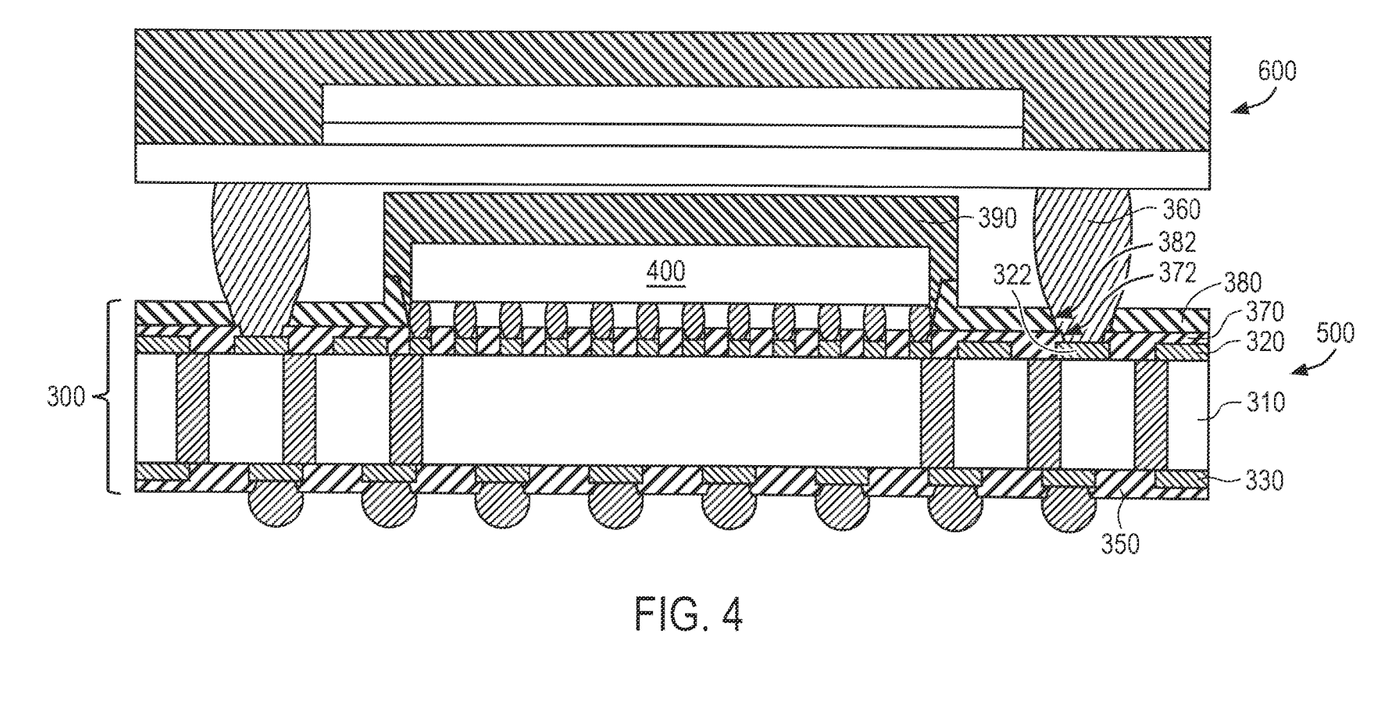
FIG. 4 is a schematic cross-sectional view of bonding a chip package structure as shown in FIG. 3I with another chip package structure.

FIG. 4 is a schematic cross-sectional view of bonding a chip package structure as shown in FIG. 3I with another chip package structure. Referring to FIG. 4, another chip package structure 600 formed in a manner of wire bonding is stacked on the chip package structure 500, and a solder ball on a substrate of the chip package structure 600 is bonded with the solder of the chip package structure 500 through the reflow soldering process, so that the chip package structure 500 is electrically connected to the chip package structure 600, so as to form a POP package structure.

Figure 5:
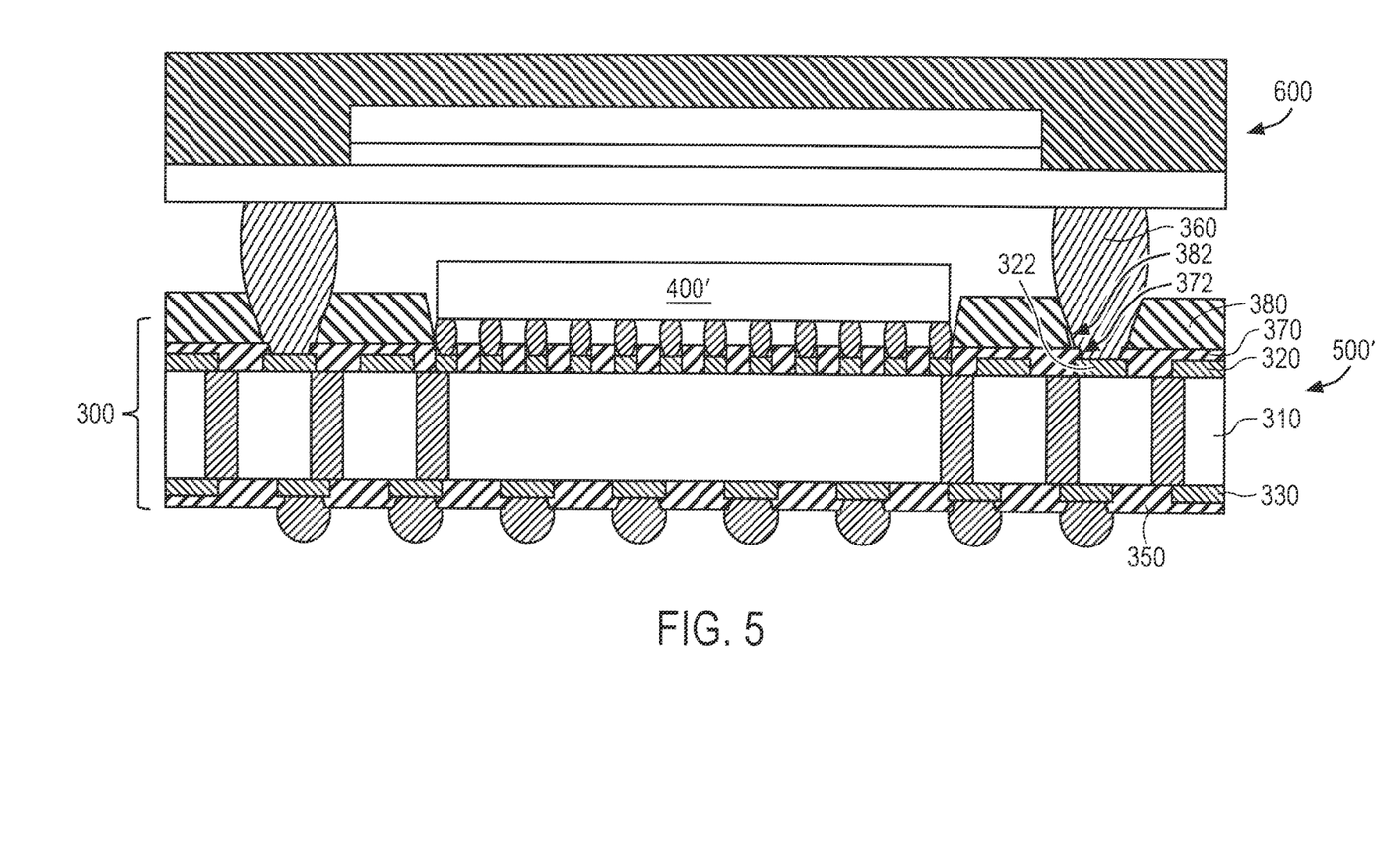
FIG. 5 is a schematic cross-sectional view of bonding a circuit substrate carrying a chip with another chip package structure.

FIG. 5 is a schematic cross-sectional view of bonding a circuit substrate carrying a chip with another package structure. Referring to FIG. 5, a bare chip 400' is disposed on the circuit substrate 300 in a manner of flip chip, for forming a chip package structure 500'. Then, another chip package structure 600 formed in a manner of wire bonding is stacked on the chip package structure 500', and a solder ball on a substrate of the chip package structure 600 is bonded with a solder of the chip package structure 500' through a reflow soldering process, such that the chip package structure 500' is electrically connected to the chip package structure 600, thereby forming another POP package structure.

To sum up, in the circuit substrate and the method of fabricating the same according to the present invention, the thickness of the solder mask is mainly increased, and the opening with an upper diameter larger than a lower diameter for exposing the bonding pad is formed in the solder mask. In this manner, when the solder of the circuit substrate is bonded with the solder ball of another package during the reflow soldering process, the solder in the opening of the solder mask is prevented from being spilled out of the opening to result in a hollow phenomenon, thereby enhancing the reliability of bonding the circuit substrate with another package.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor package comprising:
   a substrate having an upper surface;
   a bonding pad, disposed on the upper surface of the substrate;
   a first solder mask layer having a first thickness, disposed on the upper surface of the substrate, and having a first opening that exposes at least a portion of the bonding pad; and
   a second solder mask layer having a second thickness greater than the first thickness and having a second opening that exposes the at least a portion of the bonding pad, the second solder mask layer disposed over the first solder, mask layer,
   wherein:
      the first opening is tapered and includes a first top diameter an a first bottom diameter, the first top diameter being larger than the first bottom diameter;
      the second opening is tapered and includes a second top diameter and a second bottom diameter, the second top diameter being larger than the second bottom diameter; and
      the second bottom diameter is larger than the first top diameter.

2. The semiconductor package of claim 1, wherein the first opening is substantially aligned with the second opening.

3. The semiconductor package of claim 1, further comprising a conductive element located in the first opening and the second opening, the conductive element being electrically connected to the bonding pad.

4. The semiconductor package of claim 3, wherein the conductive element substantially fills the first opening and the second opening.

5. The semiconductor package of claim 3, wherein the first solder mask layer indents the conductive element.

6. The semiconductor package of claim 1, wherein the second opening exposes a portion of an upper surface of the first solder mask layer.

7. The semiconductor package of claim 1, wherein the first opening is centered over the bonding pad.

8. The semiconductor package of claim 1, wherein the second opening is centered over the first opening.

9. The semiconductor package of claim 1, further comprising a conductive element located in the first opening and the second opening, wherein an upper surface of the second solder mask layer is substantially coplanar with an upper surface of the conductive element.

10. The semiconductor package of claim 1, further comprising:
    a semiconductor die electrically connected to the substrate; and
    a molding compound encapsulating the semiconductor die, wherein a lateral surface of the molding compound is substantially coplanar with a surface of the second solder mask layer.

11. A semiconductor package comprising:
    a substrate;
    a first patterned circuit layer, the first patterned circuit layer including a contact; and
    a multi-layer solder mask disposed adjacent to the substrate and having a cavity that exposes at least a portion of the contact;
    wherein:
       an upper portion of the cavity has a first width and is disposed over a lower portion of the cavity, the lower portion of the cavity has a second width, and the first width is greater than the second width;
       the upper portion of the cavity is tapered and includes a first top width and a first bottom width, the first top width being larger than the first bottom width;
       the lower portion of the cavity is tapered and includes a second top width and a second bottom width, the second top width being larger than the second bottom width; and
       the first bottom width is larger than the second top width.

12. The semiconductor package of claim 11, wherein the multi-layer solder mask includes an upper layer haying a first thickness and a lower layer having a second thickness, wherein the first thickness is greater than the second thickness.

13. The semiconductor package of claim 12, wherein the substrate has a lower surface, and further comprising a solder mask layer disposed on the lower surface of the substrate, wherein a third thickness of the solder mask layer is less than the first thickness.

14. The semiconductor package of claim 11, further comprising:
    a semiconductor die electrically connected to the substrate; and
    a molding compound encapsulating the semiconductor die, wherein a lateral surface of the molding, compound is substantially coplanar with a surface of the multi-layer solder mask, 15. The semiconductor package of claim 11, further comprising a conductive connector extending through the cavity and electrically connected to the contact.

16. The semiconductor package of claim 15, wherein the conductive connector substantially fills the cavity.

17. The semiconductor package of claim 11, wherein the cavity is centered over the contact.

18. The semiconductor package of claim 11, further comprising a conductive connector extending through the cavity, wherein an upper surface of the multi-layer solder mask is substantially coplanar with an upper surface of the conductive connector.

19. A semiconductor package comprising:
    a circuit substrate;
    a conductive element electrically connected to the circuit substrate; and
    means for enhancing electrical connectivity between the circuit substrate, the conductive element, and another semiconductor package;
    wherein:
       an upper portion of the opening includes a first top width and a first bottom width, the first top width being larger than the first bottom width;
       a lower portion of the opening includes a second top width and a second bottom width, the second top width being larger than the second bottom width; and
       the first bottom width is larger than the second top width.

20. The semiconductor package of claim 19, wherein the means for enhancing electrical connectivity confines the conductive element during a solder reflow of the conductive element.

21. The semiconductor package of claim 19, further comprising a semiconductor die attached to the circuit substrate, wherein the means for enhancing electrical connectivity circumscribes the semiconductor die.

22. The semiconductor package of claim 21, further comprising a molding compound encapsulating the semiconductor die, wherein a lateral surface of the molding compound is substantially coplanar with a surface of the means for enhancing electrical connectivity.

23. The semiconductor package of claim 19, wherein the circuit substrate has a lower surface, and further comprising a solder mask layer having a first thickness and disposed on the lower surface of the circuit substrate, wherein the first thickness is less than a second thickness of the means for enhancing electrical connectivity.

24. The semiconductor package of claim 19, wherein the means for enhancing electrical connectivity has an opening, the conductive element extending through the opening.

25. The semiconductor package of claim 24, wherein the conductive element substantially fills the opening.

26. The semiconductor package of claim 19, wherein the means for enhancing electrical connectivity has an opening centered over a contact disposed on the circuit substrate.

27. The semiconductor package of claim 19, wherein the means for enhancing electrical connectivity has an upper surface that is substantially coplanar with an upper surface of the conductive element.

* * * * *